United States Patent
Kim et al.

(10) Patent No.: US 8,101,337 B2
(45) Date of Patent: Jan. 24, 2012

(54) METHOD OF SYNTHESIZING ITO ELECTRON-BEAM RESIST AND METHOD OF FORMING ITO PATTERN USING THE SAME

(75) Inventors: Ki-Chul Kim, Daejeon (KR); Sung-Lyul Maeng, Cheongju (KR); Sung-Jin Shin, Jeonjoo (KR); Dae-Joon Kang, Jeju (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 369 days.

(21) Appl. No.: 12/532,149

(22) PCT Filed: Mar. 19, 2008

(86) PCT No.: PCT/KR2008/001551
§ 371 (c)(1),
(2), (4) Date: Sep. 19, 2009

(87) PCT Pub. No.: WO2008/115007
PCT Pub. Date: Sep. 25, 2008

(65) Prior Publication Data
US 2010/0035179 A1    Feb. 11, 2010

(30) Foreign Application Priority Data
Mar. 19, 2007  (KR) ........................ 10-2007-0026774

(51) Int. Cl.
*G03C 5/00*     (2006.01)
*C09D 1/00*     (2006.01)
*H01L 21/316*   (2006.01)

(52) U.S. Cl. ..................... 430/296; 430/270.1; 430/942; 106/286.1; 106/286.4; 106/287.18; 106/287.19

(58) Field of Classification Search ............... 430/270.1, 430/296, 942; 106/286.1, 286.4, 287.18, 106/287.19
See application file for complete search history.

(56) References Cited

FOREIGN PATENT DOCUMENTS

| | | | |
|---|---|---|---|
| EP | 1666418 | A1 | 6/2006 |
| JP | 2000-016812 | A | 1/2000 |
| JP | 2004-055363 | A | 2/2004 |
| JP | 2004-075427 | A | 3/2004 |
| KR | 2003-0066167 | A | 8/2003 |
| KR | 2003/0066169 | A | 8/2003 |
| KR | 2005-0037729 | A | 4/2005 |
| WO | WO-2005/021436 | A1 | 3/2005 |

OTHER PUBLICATIONS

"Room-temperature deposition of thin-film indium tin oxide on micro-fabricated color filters and its application to flat-panel displays", Zhiguo Meng et al., Journal of the Society for Information Display, 2004, vol. 12, No. 1, pp. 113-118.

*Primary Examiner* — Christopher Young
(74) *Attorney, Agent, or Firm* — Rabin & Berdo, P.C.

(57) ABSTRACT

Provided is a method of synthesizing an ITO electron beam resist and a method of forming an ITO pattern. The ITO electron beam resist is synthesized by dissolving indium chloride tetrahydrate and tin chloride dihydrate in 2-ethoxy ethanol. The method of forming an ITO pattern includes: forming an ITO electron beam resist film on a substrate, forming an ITO electron beam resist pattern by patterning the ITO electron beam resist film, and forming an ITO pattern by annealing the ITO electron beam resist pattern.

9 Claims, 7 Drawing Sheets

METHOD OF SYNTHESIZING ITO ELECTRON-BEAM RESIST AND METHOD OF FORMING ITO PATTERN USING THE SAME

TECHNICAL FIELD

This application claims the benefit of Korean Patent Application No. 10-2007-0026774, filed on Mar. 19, 2007, in the Korean Intellectual Property Office, the disclosure of which is incorporated herein in its entirety by reference. The present invention relates to a method of synthesizing an indium tin oxide (ITO) electron-beam resist and a method of forming an ITO pattern using the method. The present invention is produced as a result of study supported by the IT R&D program of MIC/IITA, [2005-S-605-02, IT-BT-NT Convergent Core Technology for advanced Optoelectronic Devices and Smart Bio/Chemical Sensors].

BACKGROUND ART

Transparent electrodes are required in the fields of solar cells, transparent thermal wires and flat panel display devices including devices such as liquid crystal display devices, plasma display devices, field emission display devices, and organic electron light emitting display devices. Tin oxide $SnO_2$ and zinc oxide ZnO are used to form the transparent electrodes. However, a representative material used to form the transparent electrodes is indium tin oxide (ITO). ITO is a widely used material for forming transparent electrodes since ITO has high optical transmittance in a visible light region and has relatively high electrical conductivity.

An ITO thin film can be formed using a spray chemical vapor deposition (CVD) method, a sol-gel method, a thermal evaporation method, an e-beam evaporation method, a direct current electroplating method, a high-frequency sputtering method, or a reactive DC sputtering method. The ITO thin film is used as a transparent electrode by patterning it to a predetermined shape.

FIGS. 1 through 3 are cross-sectional views for explaining a conventional method of patterning an ITO thin film using an etching process.

Referring to FIG. 1, as described above, an ITO thin film 12 can be formed on a substrate 10 using various methods. A photoresist film 14 is coated on the ITO thin film 12. A photomask 20 is contacted on the photoresist film 14. A fine pattern 18 of a desired shape is formed on a mask substrate 16 of the photomask 20. While the photomask 20 contacts the photoresist film 14, ultraviolet rays 22 are selectively exposed onto the photoresist film 14 using an exposure apparatus (not shown).

Referring to FIGS. 2 and 3, a photoresist pattern 14a of a desired shape is formed by developing the exposed photoresist film 14. An ITO pattern 12a is formed by patterning an ITO thin film 12 using a wet etching method, a dry etching method, or etching by radiating a laser using the photoresist pattern 14a as a mask. Next, the patterning of the ITO thin film 12 is completed by removing the photoresist pattern 14a.

However, the conventional method of patterning an ITO thin film uses a wet etching method, a dry etching method, or etching by radiating a laser as an etching method. The wet etching method has advantages in that the etching process is simple and it has a high through-put. However, the wet process has drawbacks in that the exfoliation of photoresist pattern occurs during an etching process due to a weak bonding force between the photoresist pattern and the ITO thin film, and the exfoliated photoresist pattern can contaminate an etching bath. Furthermore, the wet etching method is not appropriate for forming a nano scale fine pattern due to isotropical etching characteristics of the wet etching.

The dry etching method can form a fine pattern of 5 μm or less, however, has a low through-put, and has a problem in which re-depositing of the photoresist occurs during the etching process. The etching method that uses a laser can form a fine pattern of approximately 1 μm, however, this method is only effective for forming an ITO pattern of a simple matrix stripe shape.

FIGS. 4 through 6 are cross-sectional views illustrating a conventional method of patterning an ITO thin film using a lift-off process.

Referring to FIG. 4, a photoresist film 32 is coated on a substrate 30. A photomask 38 is contacted on the photoresist film 32. A fine pattern 36 of a desired shape is formed on a mask substrate 34 of the photomask 38. While the photomask 38 contacts the photoresist film 32, ultraviolet rays 40 are selectively exposed onto the photoresist film 32 using an exposure apparatus (not shown).

Referring to FIGS. 5 and 6, a photoresist pattern 32a of a desired shape is formed by developing the exposed photoresist film 32. An ITO thin film 42 is formed on the entire surface of the substrate 30 on which the photoresist pattern 32a is formed using one of methods described above. Next, an ITO pattern 42a is formed by removing the photoresist pattern 32a and the ITO thin film 42 using a lift-off method.

DISCLOSURE OF INVENTION

Technical Problem

However, the method of forming an ITO pattern described with reference to FIGS. 4 through 6 has an advantage in that an etching process is removed, however, has a drawback in that a plurality of processes are required to form the ITO pattern. Also, the method of forming an ITO pattern described with reference to FIGS. 4 through 6 has a limit in forming ITO patterns of 1 μm or less.

Technical Solution

To address the above and/or other problems, the present invention provides a method of synthesizing an ITO electron beam resist that can be used to form an ITO pattern.

The present invention also provides a method of forming an ITO pattern using an ITO electron beam resist.

According to an aspect of the present invention, there is provided a method of synthesizing an ITO electron beam resist, the method comprising: preparing indium chloride tetrahydrate and tin chloride dihydrate; and synthesizing the ITO electron beam resist by dissolving indium chloride tetrahydrate and tin chloride dihydrate in 2-ethoxy ethanol.

According to another aspect of the present invention, there is provided a method of forming an ITO pattern comprising: synthesizing an ITO electron beam resist; forming an ITO electron beam resist film by coating the ITO electron beam resist on a substrate; forming an ITO electron beam resist pattern by patterning the ITO electron beam resist film using an electron beam writer; and forming an ITO pattern by annealing the ITO electron beam resist pattern.

According to the present invention, an ITO electron beam resist can be obtained using a method of synthesizing an ITO electron beam resist. Also, an ITO electron beam resist film is formed using the synthesized ITO electron beam resist, and an ITO pattern may be formed in a simple process after forming an ITO electron beam resist pattern using an electron beam writer.

Advantageous Effects

An ITO electron beam resist can be obtained using a method of synthesizing an ITO electron beam resist according to the present invention.

A method of forming an ITO pattern according to the present invention does not include an etching process or a lift-off process, and thus, the ITO pattern can be formed using a simple process by directly realizing a pattern on an ITO electron beam resist film using an electron beam writer. In the method of forming an ITO pattern according to the present invention, various patterns having a size as small as a few nm can be formed depending on the resolution of the electron beam writer.

The method of forming an ITO pattern according to the present invention can remove conventional problems, for example, an adhesion problem between a photoresist film and an ITO thin film, a problem of re-deposition of the photoresist, or the problem of realizing a pattern having a size less than 1 µm, which are caused in an etching process or a lift-off process.

An ITO thin film or an ITO pattern formed using an ITO electron beam resist according to the present invention has optical characteristics of having a high optical transmittance in a visible light region and has electrical characteristics of having very low resistivity.

BRIEF DESCRIPTION OF THE DRAWINGS

The above and other features and advantages of the present invention will become more apparent by describing in detail exemplary embodiments thereof with reference to the attached drawings in which.

MODE FOR THE INVENTION

Figure 1:
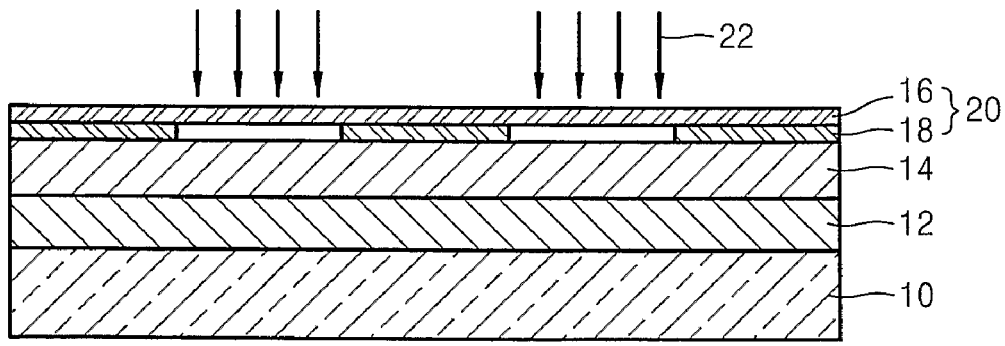
FIGS. 1 through 3 are cross-sectional views for explaining a conventional method of patterning an ITO thin film using an etching process.
Figure 2:
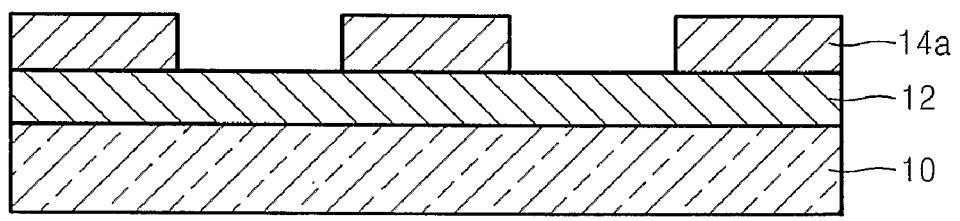
Figure 3:
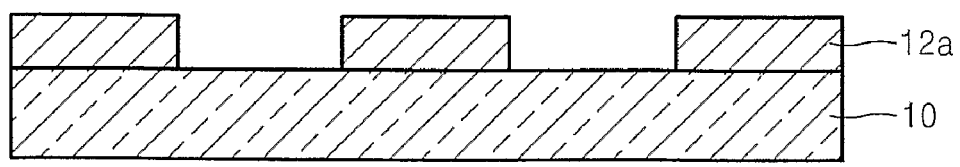
Figure 4:
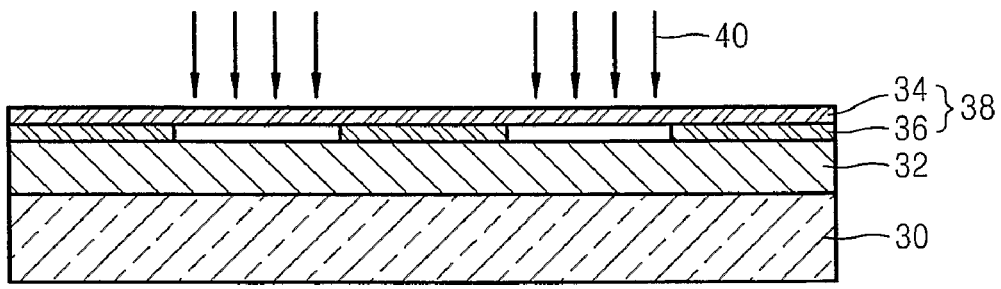
FIGS. 4 through 6 are cross-sectional views illustrating a conventional method of patterning an ITO thin film using a lift-off process.
Figure 5:
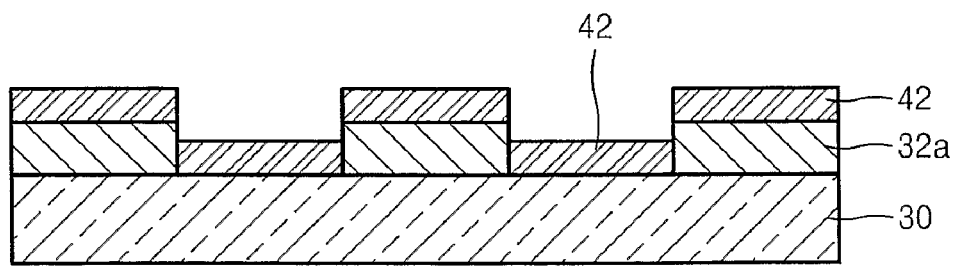
Figure 6:
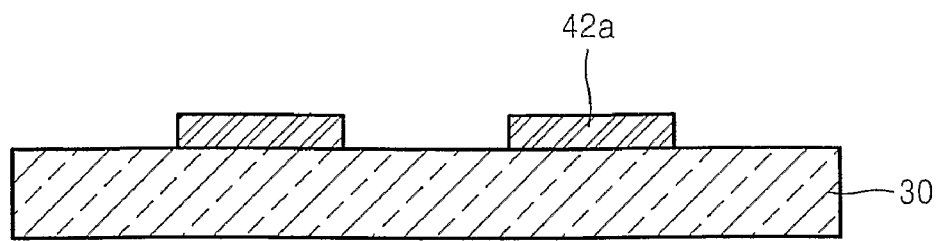

The present invention will now be described more fully with reference to the accompanying drawings in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

As described above, in order to address conventional problems caused during forming of an ITO pattern, the present invention does not use a photoresist film, but uses an ITO electron beam resist that reacts with an electron beam. A method of synthesizing the ITO electron beam resist will now be described.

Figure 7:
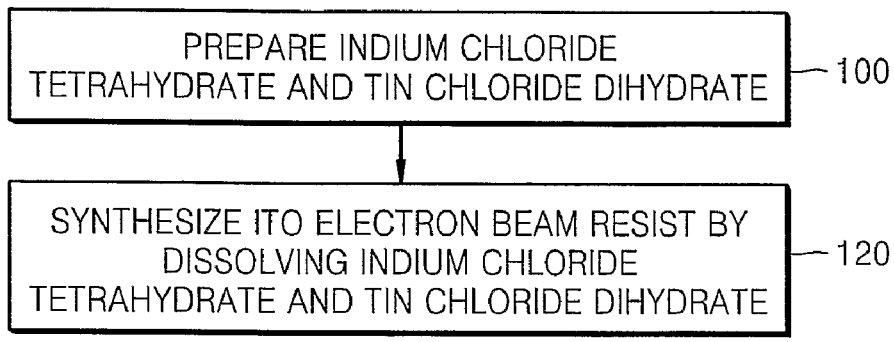
FIG. 7 is a flow chart for explaining a method of synthesizing an ITO electron beam resist according to an embodiment of the present invention.

FIG. 7 is a flow chart for explaining a method of synthesizing an ITO electron beam resist according to the present invention.

More specifically, indium chloride tetrahydrate and tin chloride dihydrate are prepared (step 100).

Next, an ITO electron beam resist is synthesized by dissolving indium chloride tetrahydrate and tin chloride dihydrate in 2-ethoxy ethanol (step 120). The mixture in which indium chloride tetrahydrate and tin chloride dihydrate are dissolved may include the indium chloride tetrahydrate and the tin chloride dihydrate in a molar ratio of 9:1.

When indium chloride tetrahydrate and tin chloride dihydrate are dissolved in 2-ethoxy ethanol, an appropriate amount of 2-ethoxy ethanol sufficient for the mixture to be in a sol state is used. In order to synthesize an ITO electron beam resist of uniform quality, the mixture is sufficiently refluxed. When the indium chloride tetrahydrate and tin chloride dihydrate are dissolved in 2-ethoxy ethanol, 2-ethoxy ethanol functions as a solvent and a stabilizer.

Next, a method of forming an ITO pattern using an ITO electron beam resist will now be described.

Figure 8:
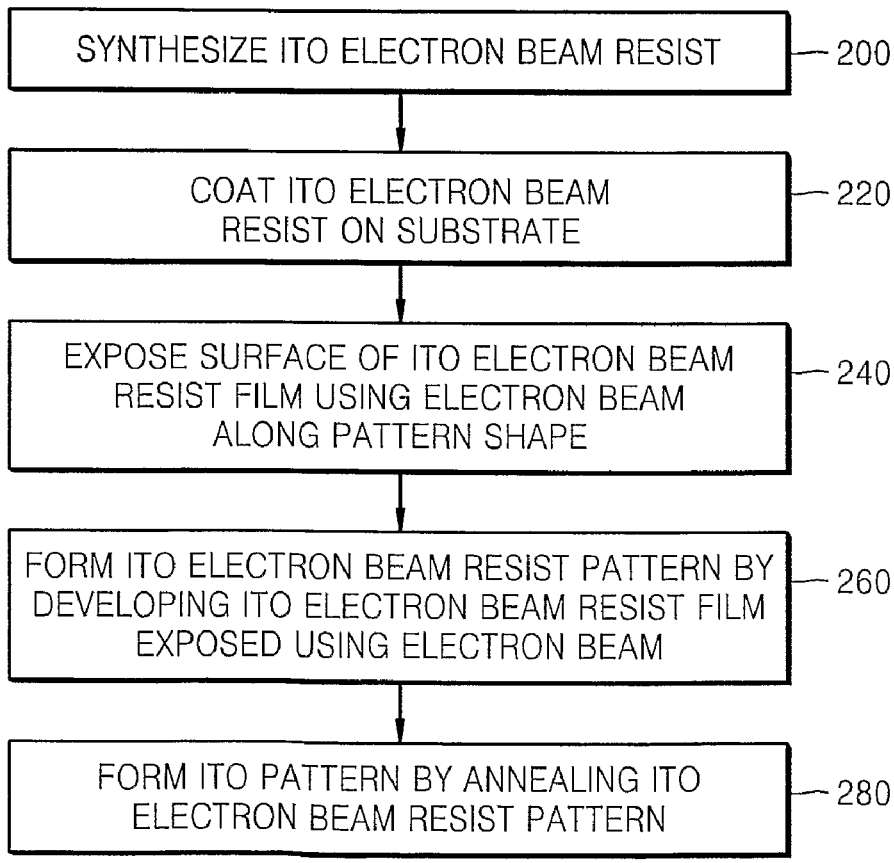
FIG. 8 is a flow chart for explaining a method of forming an ITO pattern according to an embodiment of the present invention.
Figure 9:
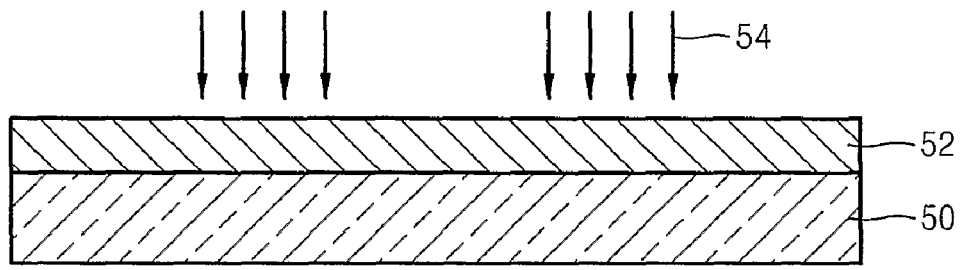
FIGS. 9 through 11 are cross-sectional views illustrating a method of forming an ITO pattern according to an embodiment of the present invention.
Figure 10:
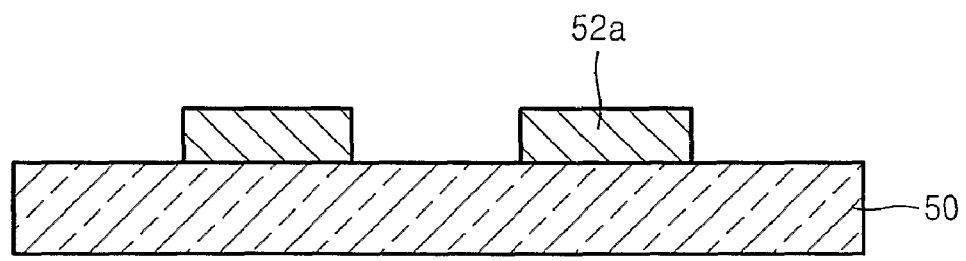
Figure 11:
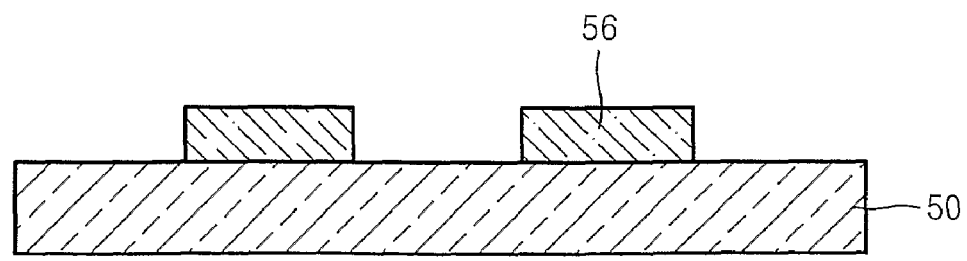

FIG. 8 is a flow chart for explaining a method of forming an ITO pattern according to an embodiment of the present invention. FIGS. 9 through 11 are cross-sectional views illustrating a method of forming an ITO pattern according to an embodiment of the present invention.

More specifically, an ITO electron beam resist is synthesized as the same manner as described above with reference to FIG. 7 (step 200). Referring to FIG. 9, a substrate 50 formed of quartz and an ITO electron beam resist film 52 is formed by coating the ITO electron beam resist on the substrate 50 (step 220).

The ITO electron beam resist can be coated using a spin coating method. The thickness of the ITO electron beam resist film 52 can be controlled during spin coating by controlling the rpm and rotation time of a spin coater. The thickness of the spin coated ITO electron beam resist film 52 may be measured using a non-contact ellipsometer.

Referring to FIG. 10, an ITO electron beam resist pattern 52a is formed by patterning the ITO electron beam resist film 52 using an electron beam writer (steps 240 and 260). In other words, the ITO electron beam resist pattern 52a is formed by directly recording and developing a fine pattern of a desired size and shape on the ITO electron beam resist film 52 using an electron beam of the electron beam writer. The resolution of the ITO electron beam resist pattern 52a depends on the resolution of the electron beam writer. If an electron beam writer having a sufficient resolution is used, the ITO electron beam resist pattern 52a having a resolution of a few nm can be formed. In other words, the ITO electron beam resist pattern 52a having a nano scale size can be formed depending on the resolution of the electron beam writer.

The method of forming the ITO electron beam resist pattern 52a will now be described in detail. As depicted in FIG. 9, a surface of the ITO electron beam resist film 52 is exposed to an electron beam 54 along a predetermined pattern using an electron beam writer (step 240). The portion of the ITO electron beam resist film 52 that is exposed to the electron beam 54 is structurally stable compared to the portion of the ITO electron beam resist film 52 that is not exposed to the electron beam 54.

When the exposing operation is finished, the substrate 50 is removed from the electron beam writer. Next, as depicted in FIG. 10, the ITO electron beam resist pattern 52a is formed by developing the portion of the ITO electron beam resist film 52 that is exposed to the electron beam 54 (step 260). A mixture of deionized water and ethanol is used as a developing solution when developing the ITO electron beam resist film 52. The mixture may have a mixing ratio between deionized water and ethanol of 10:1. The realizable quality of the ITO electron beam resist pattern 52a can be determined through controlling the exposure amount of the electron beam 54, the concentration of the developing solution, and developing time. In the present embodiment, the exposure amount of the electron beam 54 may be 40 mC/cm$^2$.

After the developing process, as depicted in FIG. 11, an ITO pattern 56 is formed by annealing the ITO electron beam resist pattern 52a. That is, the ITO electron beam resist pattern 52a is transformed to the ITO pattern 56 having high optical transmittance and high electrical conductivity through annealing the ITO electron beam resist pattern 52a. In other words, after the substrate 50 and the ITO electron beam resist pattern 52a are carefully dried, the ITO pattern 56 having high optical transmittance and high electrical conductivity is formed by annealing the ITO electron beam resist pattern 52a under an air atmosphere. In the present invention, the optical transmittance and the electrical conductivity of the ITO pattern 56 are finely controlled through varying conditions such as annealing temperature and annealing time.

As described above, since the ITO electron beam resist pattern 52a can be formed to a nano scale according to the resolution of the electron beam writer, the ITO pattern 56 can also be formed to a nano scale. The ITO pattern 56 is a electrically conductive film and thus, can be used as a fine transparent electrode. The ITO electron beam resist pattern 52a may be annealed at a temperature of 400 to 800° C. under an air atmosphere.

The method of forming an ITO pattern according to an embodiment of the present invention does not include an etching process or a lift-off process, and thus, conventional technical problems can be removed. Also, by using the method of forming an ITO pattern according to the present invention an ITO pattern having a sufficiently small nano scale can be formed depending on the resolution of the electron beam writer.

Next, various physical properties of an ITO pattern formed using the method according to the present invention will now be described. Hereinafter, the measurement results of physical properties of an ITO thin film obtained by annealing after forming an ITO electron beam resist film on a substrate will be described.

Figure 12:
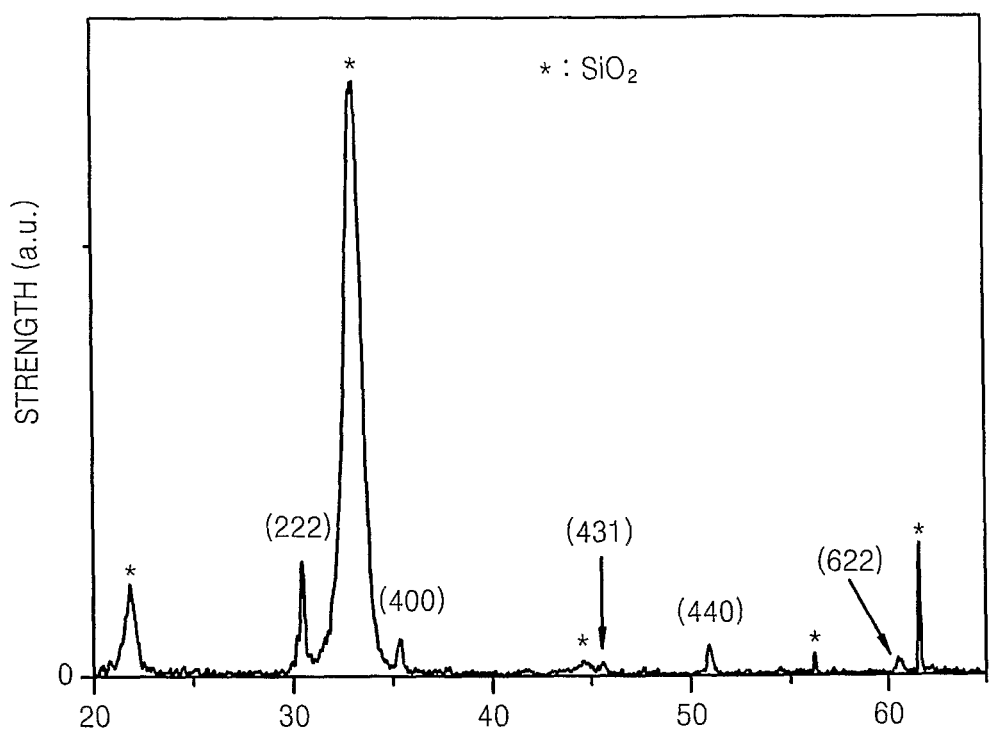
FIG. 12 is a graph showing a result of X-ray diffraction of an ITO thin film manufactured using the method according to an embodiment of the present invention.

FIG. 12 is a graph showing a result of X-ray diffraction of an ITO thin film manufactured using the method according to an embodiment of the present invention.

More specifically, after spin coating an ITO electron beam resist synthesized by using the method described above on a substrate, for example, a silicon oxide substrate, the ITO thin film formed using the method according to the present invention was obtained by annealing the substrate on which the ITO electron beam resist was coated at a temperature of approximately 500° C. for 10 minutes under an air atmosphere. X-ray diffraction was measured with respect to the ITO thin film obtained as described above.

Referring to FIG. 12, main oriented faces of diffraction peaks of the ITO thin film obtained as described above were crystal orientation faces (222), (400), (440), and (622). In FIG. 12, the symbol * indicates peaks of SiO$_2$. The main oriented faces of the ITO thin film obtained as described above were matched with the X-ray diffraction result of a standard specimen (JCPDS card, No. 44-1087) within an error range. Accordingly, it can be clearly seen that the thin film obtained as described above is an ITO thin film.

Figure 13:
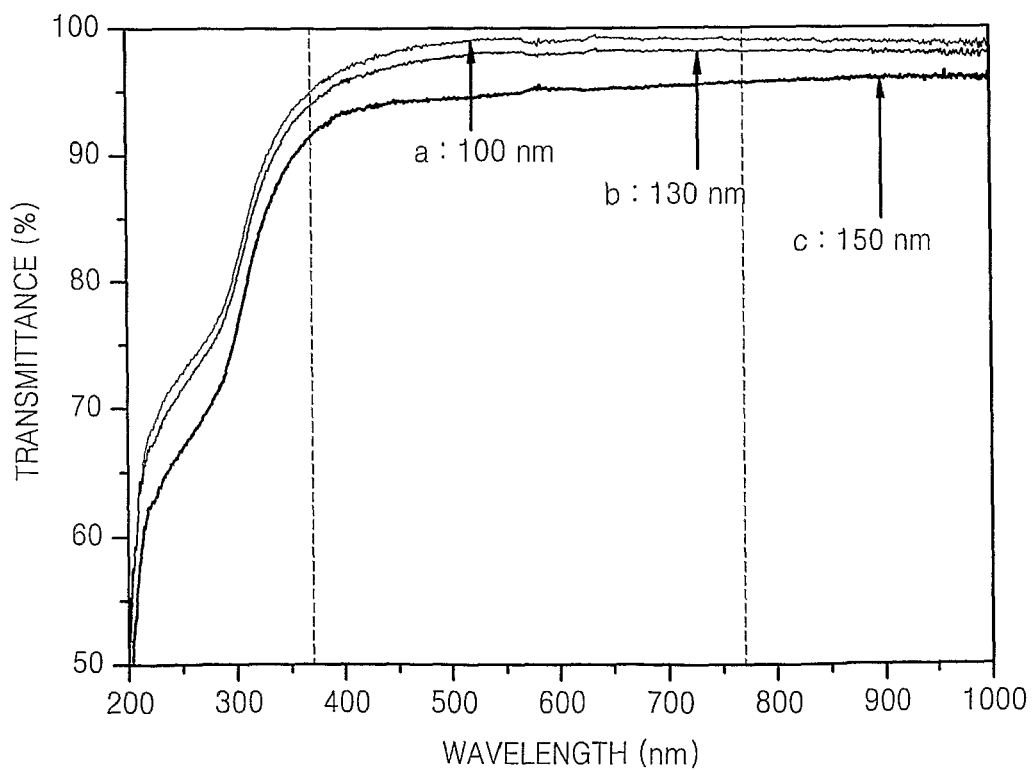
FIG. 13 is a graph showing measurement results of optical transmittance in a function of wavelength according to thicknesses of ITO thin films manufactured using the method according to an embodiment of the present invention.

FIG. 13 is a graph showing measurement results of optical transmittance as a function of wavelength for ITO thin films of various thicknesses manufactured using the method according to the present invention.

More specifically, after spin coating an ITO electron beam resist synthesized using the method described above on a substrate, for example, a silicon oxide substrate SiO$_2$, the ITO thin film formed using the method according to the present invention was obtained by annealing a substrate on which the ITO electron beam resist is spin coated. ITO thin films having thicknesses of 100 nm, 130 nm, and 150 nm were prepared. Transmittances of each of the obtained ITO thin films were measured. In FIG. 13, reference numerals a, b, and c respectively indicate the ITO thin films having thicknesses of 100 nm, 130 nm, and 150 nm.

Referring to FIG. 13, the three ITO thin films according to the present invention have optical transmittances of 90% or more in a wavelength region of approximately 380 nm or above. In particular, the ITO thin films according to the present invention have optical transmittances of 90% or above in a visible light region which is indicated by dotted line, that is, in a wavelength range from 380 nm to 780 nm. In the case of an ITO thin film manufactured using a DC magnetron sputtering method, the optical transmittance is 90 to 96% in a wavelength range from 450 to 500 nm, and the optical transmittance of the ITO thin film gradually reduces in wavelength regions higher and lower than the wavelength range of 450 to 500 nm.

Therefore, since the ITO thin film according to the present invention has optical transmittance greater than 90% for wavelengths higher than approximately 380 nm even though the thickness of the ITO thin film changes, the ITO thin film can be formed to various thicknesses and used for various purposes.

Figure 14:
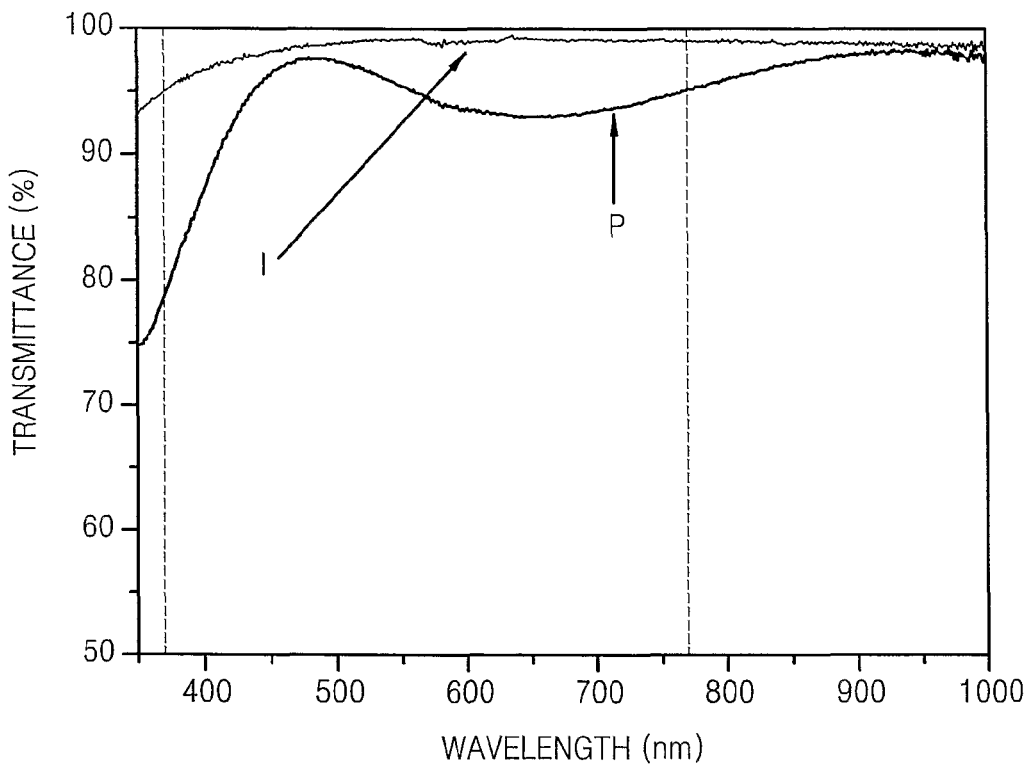
FIG. 14 is a graph showing measurement results of optical transmittances in a function of wavelength according to thicknesses of ITO thin films manufactured using a conventional method and a method according to the present invention.

FIG. 14 is a graph showing measurement results of optical transmittances as a function of wavelength for ITO thin films of various thicknesses manufactured using a conventional method and a method according to the present invention.

More specifically, after spin coating an ITO electron beam resist synthesized as the method described above on a substrate, for example, a quartz substrate, the ITO thin film formed using the method according to the present invention was obtained by annealing the quartz substrate, on which the ITO electron beam resist was coated, at a temperature of approximately 500° C. for 10 minutes in an air atmosphere.

Reference numeral 'I' indicates the result of measurement of optical transmittance of an ITO thin film having a thickness of 130 nm manufactured using the method according to the present invention, and reference numeral 'P' indicates the result of measurement of optical transmittance of an ITO thin film having a thickness of 130 nm manufactured using a conventional technique, for example, a DC magnetron sputtering method. Referring to FIG. 14, the ITO thin film manufactured using the method according to the present invention has an optical transmittance greater than that of the ITO thin film manufactured using a conventional technique. In particular, the ITO thin film according to the present invention has an optical transmittance of 90% or above in a visible light region, that is, in a wavelength range from 380 to 780 nm as indicated by dotted lines.

Figure 15:
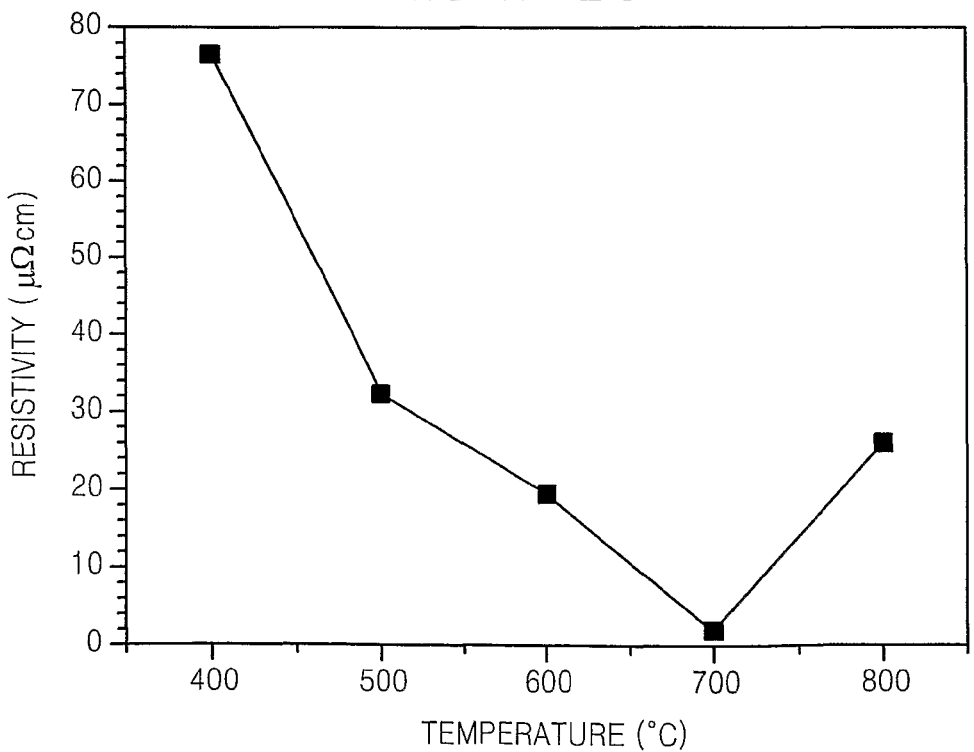
FIG. 15 is a graph showing a resistivity according to thermal treating temperature of an ITO thin film manufactured using the method according to an embodiment of the present invention.

FIG. 15 is a graph showing a resistivity according to thermal treating temperature of ITO thin films manufactured using the method according to an embodiment of the present invention.

More specifically, after spin coating an ITO electron beam resist synthesized as the method described above on a substrate, for example, a quartz substrate, the ITO thin film according to an embodiment of the present invention was obtained by annealing the quartz substrate, on which the ITO electron beam resist was coated, at a temperature of approximately 800° C. for 10 minutes under an air atmosphere.

Referring to FIG. 15, the ITO thin film manufactured using the method according to the present invention has a low resistivity of a range from 28 to 76 μΩcm. In particular, an ITO thin film that has been annealed at a temperature of 500° C. has the resistivity of as low as approximately 30 μΩcm, and thus, in consideration of annealing temperature, the ITO thin film has an optimum resistivity.

However, an ITO thin film manufactured using a conventional DC magnetron sputtering method and a chemical vapor deposition (CVD) method respectively have resistivity levels of 150 μΩcm and 170 μΩcm. That is, an ITO thin film manufactured using the method according to the present invention has a resistivity lower than an ITO thin film manufactured using a conventional method, and thus, has good electrical characteristics.

Figure 16:
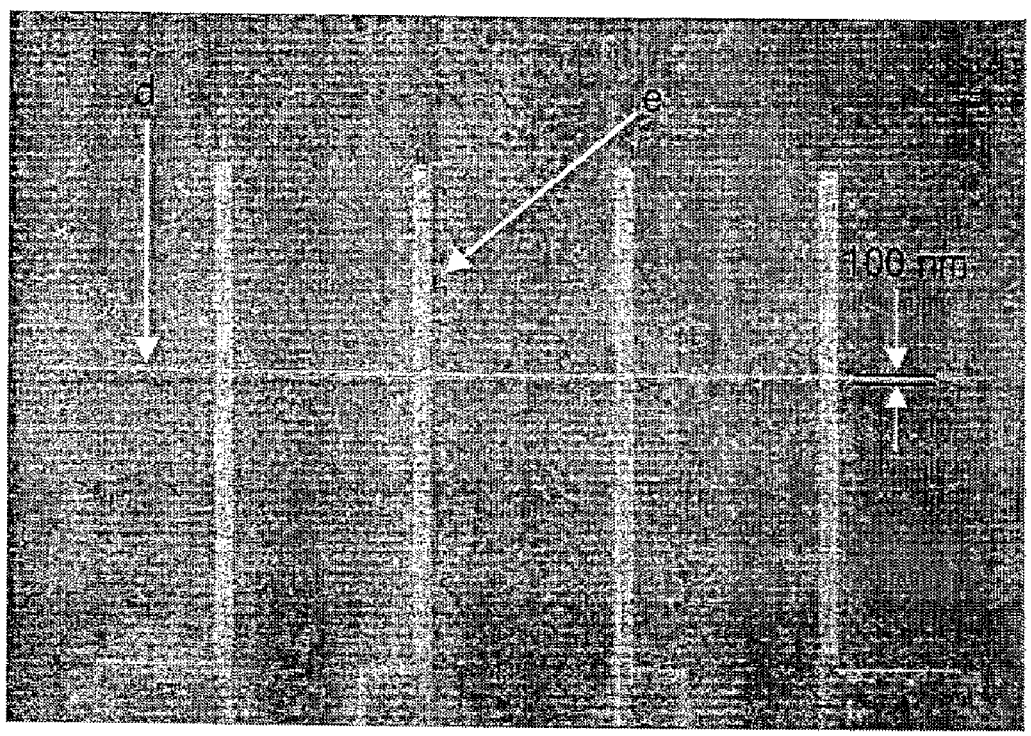
FIG. 16 is a scanning electron microscopy (SEM) image of an ITO pattern manufactured using the method according to an embodiment of the present invention.

FIG. 16 is a scanning electron microscopy (SEM) image of an ITO pattern manufactured using the method according to an embodiment of the present invention.

Reference numeral 'd' indicates an ITO pattern manufactured using the method according to the present invention. The ITO pattern d has a width of 100 nm. The SEM image of FIG. 16 also includes Au electrodes e which are formed to measure the electrical characteristics described above. Referring to FIG. 16, as a result, it can be said that the formation of an ITO thin film or an ITO pattern of a nano-scale using ITO electron beam resist synthesized using a method of synthesizing an ITO electron beam resist according to the present invention is successful.

As described above, an ITO electron beam resist can be obtained using a method of synthesizing an ITO electron beam resist according to the present invention.

A method of forming an ITO pattern according to the present invention does not include an etching process or a lift-off process, and thus, the ITO pattern can be formed using a simple process by directly realizing a pattern on an ITO electron beam resist film using an electron beam writer. In the method of forming an ITO pattern according to the present invention, various patterns having a size as small as a few nm can be formed depending on the resolution of the electron beam writer.

The method of forming an ITO pattern according to the present invention can remove conventional problems, for example, an adhesion problem between a photoresist film and an ITO thin film, a problem of re-deposition of the photoresist, or the problem of realizing a pattern having a size less than 1 μm, which are caused in an etching process or a lift-off process.

An ITO thin film or an ITO pattern formed using an ITO electron beam resist according to the present invention has optical characteristics of having a high optical transmittance in a visible light region and has electrical characteristics of having very low resistivity.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

The present invention provides a method of synthesizing an ITO electron beam resist. Also, the present invention also provides a method of forming an ITO pattern using an ITO electron beam resist.

The invention claimed is:

1. A method of synthesizing an ITO electron beam resist comprising: preparing indium chloride tetrahydrate and tin chloride dihydrate; and synthesizing the ITO electron beam resist by dissolving indium chloride tetrahydrate and tin chloride dihydrate in 2-ethoxy ethanol.

2. The method of claim 1, wherein, in a mixture made by dissolving indium chloride tetrahydrate and tin chloride dihydrate in 2-ethoxy ethanol, a molar ratio between indium chloride tetrahydrate and tin chloride dihydrate is 9:1.

3. The method of claim 1, wherein, when indium chloride tetrahydrate and tin chloride dihydrate are dissolved in 2-ethoxy ethanol, 2-ethoxy ethanol functions as a solvent and a stabilizer.

4. A method of forming an ITO pattern comprising:
synthesizing an ITO electron beam resist;
forming an ITO electron beam resist film by coating the ITO electron beam resist on a substrate;
forming an ITO electron beam resist pattern by patterning the ITO electron beam resist film using an electron beam writer; and
forming an ITO pattern by annealing the ITO electron beam resist pattern.

5. The method of claim 4, wherein the ITO electron beam resist is obtained by dissolving indium chloride tetrahydrate and tin chloride dihydrate in 2-ethoxy ethanol.

6. The method of claim 5, wherein the forming of an ITO electron beam resist pattern comprises exposing an electron beam on a surface of the ITO electron beam resist film along a predetermined pattern shape using the electron beam writer; and developing the ITO electron beam resist film which is exposed to the electron beam.

7. The method of claim 6, wherein, when developing the ITO electron beam resist film, deionized water and ethanol are used as a developing solution.

8. The method of claim 7, wherein the deionized water and ethanol are mixed in a ratio of 10:1.

9. The method of claim 4, wherein the ITO pattern is a transparent conductive film.

* * * * *